(12) United States Patent
Jin et al.

(10) Patent No.: US 7,902,569 B2
(45) Date of Patent: Mar. 8, 2011

(54) SI/SIGE INTERBAND TUNNELING DIODES WITH TENSILE STRAIN

(75) Inventors: Niu Jin, San Jose, CA (US); Paul R. Berger, Columbus, OH (US); Philip E. Thompson, Sprinfield, VA (US)

(73) Assignees: The Ohio State University Research Foundation, Columbus, OH (US); The United States of America as represented by the Secretary of the Navy, Washington, DC (US)

( * ) Notice: Subject to any disclaimer, the term of this patent is extended or adjusted under 35 U.S.C. 154(b) by 421 days.

(21) Appl. No.: 12/175,114

(22) Filed: Jul. 17, 2008

(65) Prior Publication Data
US 2009/0020748 A1      Jan. 22, 2009

Related U.S. Application Data

(60) Provisional application No. 60/959,889, filed on Jul. 17, 2007.

(51) Int. Cl.
*H01L 29/88* (2006.01)
*H01L 21/329* (2006.01)

(52) U.S. Cl. .................. 257/104; 257/E29.34; 438/141; 438/979

(58) Field of Classification Search .................. 257/104, 257/E29.34; 438/141, 979
See application file for complete search history.

(56) References Cited

U.S. PATENT DOCUMENTS

| | | | |
|---|---|---|---|
| 6,105,866 A | 8/2000 | Morrison | |
| 6,218,677 B1 | 4/2001 | Broekaert | |
| 6,271,551 B1 | 8/2001 | Schmitz et al. | |
| 6,677,192 B1 | 1/2004 | Fitzgerald | |
| 6,724,008 B2 | 4/2004 | Fitzergald | |
| 6,747,198 B1 | 6/2004 | Sullivan | |
| 6,803,598 B1 | 10/2004 | Berger et al. | |
| 7,041,170 B2 | 5/2006 | Fitzgerald et al. | |
| 7,105,866 B2 | 9/2006 | El-Zein et al. | |
| 7,297,990 B1 | 11/2007 | Berger et al. | |
| 7,303,969 B2 | 12/2007 | Berger et al. | |
| 7,361,943 B2 | 4/2008 | Berger et al. | |
| 2003/0049894 A1 | 3/2003 | Berger et al. | |
| 2006/0284165 A1 | 12/2006 | Berger et al. | |

OTHER PUBLICATIONS

Stoffel et al., *Epitaxial Growth of SiGe Interband Tunneling Diodes on Si (001). . .* , IEICE Trans. Electron., vol. E89-C, No. 7, pp. 921-925, Jul. 2006.

Chung et al., *Si/SiGe Resonant Interband Tunnel Diode with fr () 20.2 GHz and Peak. . .* , IEEE Electron Device Letters, vol. 27, No. 5, pp. 364-367, May 2006.

(Continued)

*Primary Examiner* — Evan Pert
(74) *Attorney, Agent, or Firm* — Fay Sharpe LLP

(57) ABSTRACT

Some disclosed interband tunneling diodes comprise a plurality of substantially coherently strained layers including layers selected from a group consisting of silicon, germanium, and alloys of silicon and germanium, wherein at least one of said substantially coherently strained layers is tensile strained. Some disclosed resonant interband tunneling diodes comprise a plurality of substantially coherently strained layers including layers selected from a group consisting of silicon, germanium, and alloys of silicon and germanium, wherein at least one of said substantially coherently strained layers defines a barrier to non-resonant tunnel current. Some disclosed interband tunneling diodes comprise a plurality of substantially coherently strained layers, wherein at least one of said substantially coherently strained layers is tensile strained. Some disclosed resonant interband tunneling diodes comprise a plurality of substantially coherently strained layers, wherein at least one of said substantially coherently strained layers defines a barrier to non-resonant tunnel current.

25 Claims, 8 Drawing Sheets

OTHER PUBLICATIONS

Yoon et al., *Room-temperature negative differential resistance in polymer...*, Applied Physics Letters 87, 203506, Nov. 2005.

Jin et al., *RF Performance and Modeling of Si/SiGe Resonant Interband...*, IEEE Transactions of Electron Devices, vol. 52, No. 10, pp. 2129-2135, Oct. 2005.

Jin et al., *High Sensitivity Si-Based Backward Diodes for Zero Biased Square-Law...*, IEEE Electron Device Letters, vol. 26, No. 8, pp. 575-578, Aug. 2005.

Jin et al., *Temperature dependent DC/RF performance of Si/SiGe resonant...*, Electronics Letters, vol. 41, No. 9, Apr. 2005.

Khorenko et al. *Influence of layer structure on the current-voltage characteristics...*, Journal of Applied Physics, vol. 86, No. 7, pp. 8348-8351. Oct. 2004.

Weaver et al., *Radiation Tolerance of Si/Si$_{0.6}$ Fe$_{0.4}$ Resonant Interband Tunneling Diodes*, American Institute of Physics, vol. 95, No. 11, pp. 6406-6408, Jun. 2004.

Jin et al., *151 kA/cm$^2$ Peak current Densities in Si/SiGe resonant interband...*, Applied Physics Letters, vol. 83, No. 16, pp. 3308-3310, Oct. 2003.

Jin et al., *Diffusion Barrier Cladding in Si/SiGe Resonant Interband Tunneling...*, IEEE Transactions on Electron Devices, vol. 50, No. 9, pp. 1876-1884, Sep. 2003.

Jin et al., *pnp Si resonant interband tunnel diode with symmetrical NDR*, Electronics Letters, vol. 37, No. 23, pp. 1412-1414, Nov. 2001.

Auer, et al., *Low-Voltage MOBILE Logic Module Based on Si/SiGe Interband Tunnelling Diodes*, IEEE Electron Device Letters, vol. 22, No. 5, pp. 215-217, May 2001.

Hobart, et al., *"p-on-n" Si interband tunnel diode grown by molecular beam epitaxy*, J. Vac. Sci. Technol. B 19(1), pp. 290-293, Jan./Feb. 2001.

Duschl, et al., *Room temperature I-V characteristics of Si/Si$_{1-x}$Ge$_x$/Si interband...*, Elsevier, E 7, pp. 836-839, 2000.

Eberl et al., *Self-assembling SiGe and SiGeC nanostructures for light emitters and tunneling diodes*, Elsevier, Thin Solid Films, 360, pp. 33-28, 2000.

Duschl et al., *Epitaxially grown Si/SiGe interband tunneling diodes with high room-temperature...*, Applied Physics Letters, vol. 76, vol. 7, pp. 879-881, 2000.

Duschl et al., *Physics and Applications of Si/SiGe/Si resonant interband tunneling diodes*, Elsevier, Thin Solid Films, 380, pp. 151-153, 2000.

Dashiell et al., *Current-Voltage Characteristics of High Current Density Silicon Esaki Diodes...*, IEEE Transactions on Electron Devices, vol. 47, No. 9, pp. 1707-1714, Sep. 2000.

Thompson et al., *Epitaxial Si-based tunnel diodes*, Elsevier, Thin Solid Films, 380, pp. 145-150, 2000.

Jin, et al., *Phosphorus diffusion in Si-based resonant interband tunneling diodes and tri-state...*, Elsevier, Materials Science in Semiconductor Processing 8, pp. 411-416, 2005.

Jin, et al., *Improved vertically stacked Si/SiGe resonant interband tunnel diodes...*, Electronics Letters, vol. 40, No. 25, Nov. 2004.

Jin, et al., *Tri-State Using Vertically Integrated Si-SiGe Resonant Interband Tunneling...*, IEEE Electron Device Letters, vol. 25, No. 9, pp. 646-648, 2004.

Chung, et al., *Annealing of defect density and excess currents in Si-based tunnel...*, Journal of Applied Physics, vol. 96, No. 1, pp. 747-753, 2004.

Chung, et al., *Three-terminal Si-based negative differential resistance circuit element...*, Applied Physics Letters, vol. 84, No. 14, pp. 2688-2690, 2004.

Sudirgo, et al., *Monolithically integrated Si/SiGe resonany interband tunnel diode/CMOS...*, Elsevier, Solid-State Electronics 48, pp. 1907-1910, 2004.

Article titled *International Technology Roadmap for Semiconductors, 2003 Edition—Emerging Research Devices*.

Rivas et al., *Full band modeling of excess current in a delta-doped silicon...*, Journal of Applied Physics, vol. 94, No. 8, pp. 5005-5013, 2003.

Chung et al., *Growth temperature and dopant species effects on deep levels...*, Journal of Applied Physics, vol. 93, No. 11, pp. 9104-9110, 2003.

Geppert, *The Amazing Vanishing Transistor Act*, IEEE Spectrum, pp. 28-33, 2002.

Rivas et al., *Full band stimulation of indirect phonon assisted tunneling in a silicon...*, Applied Physics Letters, vol. 78, No. 6, pp. 814-821, 2001.

Auer et al., *Low-Voltage MOBILE Logic Module Based on Si/SiGe Interband...*, IEEE Electron Device Letters, vol. 22, No. 5, pp. 215-217, 2001.

Eberl, et al., *Self-assembling SiGe and SiGeC nanostructures for light emitters...*, Elsevier, Thin Solid Films 369, pp. 33-38, 2000.

Geppert, *Quantum Transistors: toward nanoelectronics*, IEEE Spectrum, pp. 46-51, 2000.

Schulman et al., *Sb-Heterostructure Interband Backward Diodes*, IEEE Electron Device Letters, No. 21, No. 7, pp. 353-355, 2000.

Rommel et al., *Epitaxially Grown Si Resonant Interband Tunnel Diodes Exhibiting High...*, IEEE Electron Device Letters, vol. 20, No. 7, pp. 329-331, 1999.

Duschl et al., *High room temperature oeak-to-valley current ratio in Si based Esaki diodes*, Electronics Letters, vol. 35, No. 13, 1999.

Rommel et al., *Room temperature operation of epitaxially grown Si/Si$_{0.5}$Ge$_{0.5}$/Si resonant...*, Applied Physics Letters, vol. 73, No. 15, pp. 2191-2193, 1998.

Soderstrom et al., *New negative differential resistance device based on interband...*, Appl. Phys. Lett. 55, pp. 1094-1096, 1989.

Jin et al., "Phosphorus diffusion in Si-based resonant interband tunneling diodes . . .," Materials Science in Semiconductor Processing 8, pp. 411-416, 2005.

Rivas et al., "Full band modeling of the excess current in a delta-doped . . .," Journal of Applied Physics, vol. 94, No. 8, 2003.

Thompson et al., "Si resonant interband tunnel diodes grown by low-temperature . . ." Applied Physics Letters, vol. 75, No. 9, 1999.

Rommel et al., "Si-based Interband Tunneling Devices for High-Speed Logic and . . .," IEEE, 3 pp., 1998.

Rommel et al., "Development of δB/i-Si/δSb and . . . ," 2 pp, Jul. 2004.

| STRUCTURE A | | STRUCTURE B | |
|---|---|---|---|
| | | 24 → | 100 nm n+ $Si_{0.8}Ge_{0.2}$ |
| 24 → | 100 nm n+ $Si_{0.8}Ge_{0.2}$ | 32 → | 2 nm n+ Si |
| 22 → | P δ-doping layer | 22 → | P δ-doping layer |
| 20 → | 2 nm i $Si_{0.8}Ge_{0.2}$ spacer | 30 → | 2 nm i Si spacer |
| 18 → | 4 nm i $Si_{0.4}Ge_{0.6}$ spacer | 18 → | 4 nm i $Si_{0.4}Ge_{0.6}$ spacer |
| 16 → | B δ-doping layer | 16 → | B δ-doping layer |
| 14 → | 1 nm p+ $Si_{0.4}Ge_{0.6}$ | 14 → | 1 nm p+ $Si_{0.4}Ge_{0.6}$ |
| 12 → | 260 nm p+ $Si_{0.8}Ge_{0.2}$ | 12 → | 260 nm p+ $Si_{0.8}Ge_{0.2}$ |
| 10 → | $Si_{0.8}Ge_{0.2}$ substrate | 10 → | $Si_{0.8}Ge_{0.2}$ substrate |

FIGURE 1A          FIGURE 1B

STRUCTURE C

- 24 → 100 nm n+ $Si_{0.8}Ge_{0.2}$
- 32 → 2 nm n+ Si
- 22 → P delta doping layer
- 30' → 1 nm i Si spacer
- 18' → 4 nm i $Si_{0.5}Ge_{0.5}$ spacer
- 16 → B delta doping layer
- 14' → 1 nm p+ $Si_{0.5}Ge_{0.5}$
- 12 → 260 nm p+ $Si_{0.8}Ge_{0.2}$
- 10 → $Si_{0.8}Ge_{0.2}$ substrate

FIGURE 5A

STRUCTURE D

- 24 → 100 nm n+ $Si_{0.8}Ge_{0.2}$
- 42 → *2 nm n+ $Si_{0.5}Ge_{0.5}$*
- 32 → 2 nm n+ Si
- 22 → P delta doping layer
- 30' → 1 nm i Si spacer
- 18' → 4 nm i $Si_{0.5}Ge_{0.5}$ spacer
- 16 → B delta doping layer
- 14' → 1 nm p+ $Si_{0.5}Ge_{0.5}$
- 40 → *2 nm p+ Si*
- 12 → 260 nm p+ $Si_{0.8}Ge_{0.2}$
- 10 → $Si_{0.8}Ge_{0.2}$ substrate

FIGURE 5B

SI/SIGE INTERBAND TUNNELING DIODES WITH TENSILE STRAIN

This application claims the benefit of U.S. Provisional Application No. 60/959,889 filed Jul. 17, 2007. U.S. Provisional Application No. 60/959,889 filed Jul. 17, 2007 is incorporated by reference herein in its entirety.

This invention was made with Government support under grant no. DMR 0103248 awarded by the National Science Foundation and under grant no. ECS 0323657 awarded by the National Science Foundation. The Government has certain rights in this invention.

BACKGROUND

The following relates to the semiconductor arts, electronics arts, and related arts.

Interband tunnel diodes (ITDs) have numerous potential and actual applications, including but not limited to local oscillators, frequency locking circuits, advanced SRAM circuits, highly integrated analog/digital converters, high speed digital latches, and so forth. Tunneling is a very fast phenomenon; hence ITD-based devices typically are operable at high frequencies.

Interband tunneling diode devices include degenerately doped n-type and p-type regions, sometimes very thin, in sufficiently close relative proximity so that electrons and holes can cross the p/n junction by quantum mechanical tunneling. In some ITD devices, the degenerate doping is achieved using delta doping to concentrate the doping density to approximately the solid solubility limit. If the delta doping is very thin and of high enough doping density, it can also lead to quantum well regions that confine carriers. With a quantum well on the p-side and n-side of the p/n junction diode, resonant interband tunneling (e.g. RITD) can occur when the quantum wells are spaced closed enough for an overlap of the carrier wavefunctions.

Silicon based ITD devices have been produced, for example as described in Berger et al., U.S. Pat. No. 6,803,598 and Berger et al. U.S. Publ. Appl. No. 2003/0049894 A1. Both of these references are incorporated herein by reference in their entireties. As set forth in U.S. Pat. No. 6,803,598 and U.S. Publ. Appl. No. 2003/0049894 A1, silicon based interband tunneling diodes comprise "Si-compatible" layers which refers to any material which may be readily deposited, oxidized, converted, or grown on a Si substrate or device. Si-compatible layers include but are not limited to the following: Si, Ge, C, Sn, $Si_{1-x}Ge_x$, $Si_{1-x}C_x$, $Si_{1-x}Sn_x$, $Si_{1-x-y}Ge_xC_y$, $Si_{1-x-y-z}Ge_xC_ySn_z$, $Si_{1-x}O_x$, $Si_{1-x}N_x$, $Al_{1-x}O_x$, or combinations thereof. Si-compatible layers include but are not limited to group IV alloys. Typically, silicon based ITD devices are grown on a silicon substrate by a relatively low temperature method so as to limit diffusion of the high concentration dopants, and layers of high germanium content have been used to further constrain diffusion of p-type dopants. Post-growth rapid thermal annealing at temperatures well above the growth temperature for a relatively short anneal time has been found to have beneficial effects.

However, further improvements in the peak-to-valley current ratio (PVCR) and other device parameters of interest are still sought. Existing Si-based ITD designs do not provide sufficient flexibility to achieve desired improvements.

One perceived limitation is an upper limit on the integrated amount of germanium that can be incorporated into the structure due to crystallographic strain limitations. Stoffel et al., "Epitaxial Growth of SiGe Interband Tunneling Diodes on Si(001) and on $Si_{0.7}Ge_{0.3}$ Virtual Substrates", IEICE Trans. Electron. Vol. E89-C, no. 7, pp. 921-25 (2006) have attempted to overcome this limitation by forming Si-based ITD devices on a "virtual" $Si_{0.7}Ge_{0.3}$ substrate. Stoffel et al. is incorporated herein by reference in its entirety. In the approach of Stoffel et al., a graded buffer starting with silicon but gradually adding increasing germanium content is deliberately deposited in a manner that exceeds the critical thickness for relaxation of the developing crystallographic strain. As a result, the top of this graded buffer is substantially strain-relaxed, that is, has a lattice constant substantially corresponding to unstrained $Si_{0.7}Ge_{0.3}$. Using this relaxed $Si_{0.7}Ge_{0.3}$ layer as a virtual substrate of larger lattice constant than silicon, Stoffel et al. were able to fabricate ITD devices with higher germanium content. However, the highest room temperature PVCR achieved was 1.36. For comparison, Jin et al., "RF performance and Modeling of Si/SiGe Resonant Interband Tunneling Diodes", IEEE Transactions on Electron Devices vol. 52 no. 10, pp. 2129-35 (2005) report PVCR values as high as 2.9 for a device structure incorporating a backside layer of $Si_{0.6}Ge_{0.4}$ to prevent diffusion of the boron dopant away from the p-type δ-doping. Jin et al., "RF performance and Modeling of Si/SiGe Resonant Interband Tunneling Diodes", IEEE Transactions on Electron Devices vol. 52 no. 10, pp. 2129-35 (2005) is incorporated herein by reference in its entirety.

The results of Stoffel et al. may be affected by lower substrate quality due to dislocations in the strain-relaxed $Si_{0.7}Ge_{0.3}$ virtual substrate. However, even allowing for this, the approach of Stoffel has certain disadvantages. For example, the higher germanium content which is the object of the approach of Stoffel et al. can introduce detrimental alloy scattering. Accordingly, the ability to further enrich layers with germanium using a virtual substrate, as suggested by Stoffel et al., may ultimately be an ineffective avenue toward further improvement.

BRIEF DESCRIPTION OF THE DRAWINGS

Unless otherwise noted, the drawings are not to scale or proportion. The drawings are provided only for purposes of illustrating preferred embodiments and are not to be construed as limiting.

FIGS. 1A and 1B diagrammatically illustrate epi-layer structures (Structure A and Structure B, respectively) implementing interband tunneling diode devices.

FIGS. 5A and 5B diagrammatically illustrate epi-layer structures (Structure C and Structure D, respectively) implementing interband tunneling diode devices.

Figure 2A:
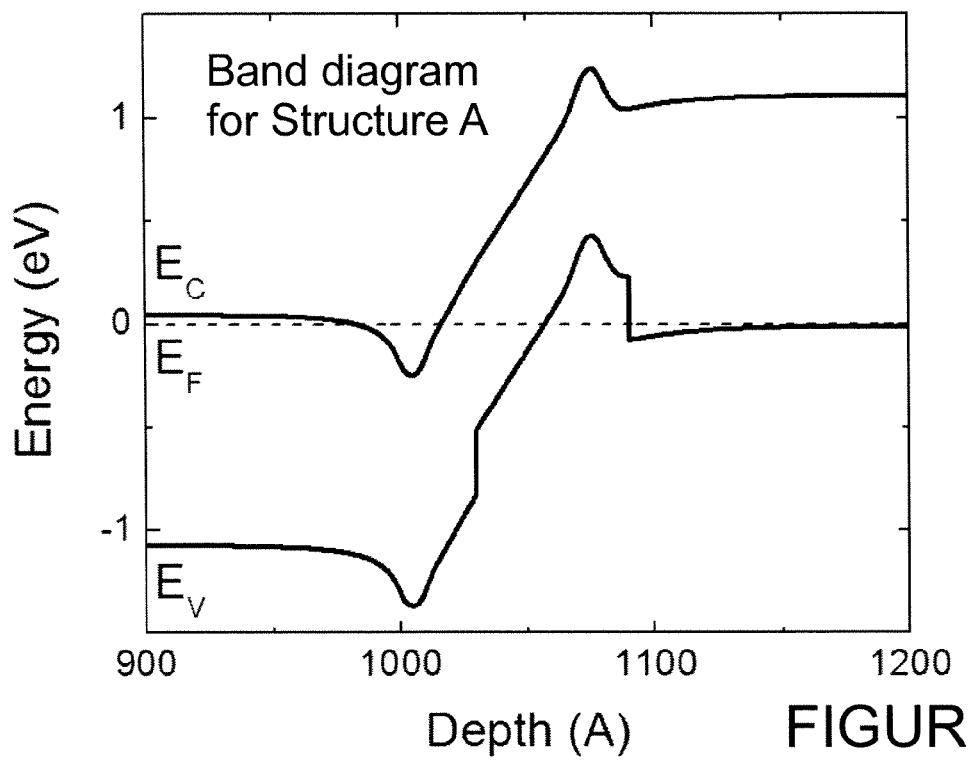
FIGS. 2A and 2B diagrammatically illustrate band diagrams for the Structure A and Structure B of FIGS. 1A and 1B, respectively.

of interband tunneling diodes formed on a silicon substrate and on a $Si_{0.8}Ge_{0.2}$ substrate, respectively.

DETAILED DESCRIPTION OF PREFERRED EMBODIMENTS

Strain engineered Si-based resonant interband tunneling diodes (RITD) were grown on commercially available $Si_{0.8}Ge_{0.2}$ virtual substrates (available from Amberwave Systems, Salem, N.H.). In these devices, strain induced band offsets were effectively utilized to improve tunnel diode performance, more specifically, their peak-to-valley current ratio (PVCR). By growing tensile strained Si layers cladding the P δ-doping plane, the quantum well formed by the P δ-doping plane is deepened, which consequently increases the optimal annealing temperature from 800° C. to 835° C. and improves PVCR by up to 1.8×.

Some Si-based RITD designs and processes combine: (i) p and n δ-doped injectors to create defined quantum wells and satisfy the degeneracy doping condition; (ii) a composite i-layer inserted as a spacer layer between the δ-doped injectors to minimize dopant interdiffusion that leads to a widening of the spacer and a larger tunneling distance, (iii) low-temperature molecular beam epitaxy (LT-MBE) growth to suppress segregation and diffusion, and (iv) a short post-growth rapid thermal anneal (RTA) heat treatment to reduce point defects created during the LT-MBE process that lead to an elevated excess current via defect related tunneling.

An advantage offered by SiGe virtual substrates is that a higher Ge content spacer can be used to increase tunneling probability, hence raise the resistive cutoff frequency, without exceeding the critical thickness. In the strain engineered Si-based RITDs grown on commercially available virtual $Si_{0.8}Ge_{0.2}$ substrates as disclosed herein, strained Si layers were inserted into the designed structure to modify the corresponding band diagram.

The commercial p-type $Si_{0.8}Ge_{0.2}$ virtual substrate with a 17.5 nm Si cap layer was grown on a Si substrate (Boron doped, 0.01-0.015Ω·cm) by the CVD technique. The $Si_{0.8}Ge_{0.2}$ uniform cap relaxation is greater than 98%. The total threading dislocations is expected to be less than $2 \times 10^6$ $cm^{-2}$. Because the cap relaxation is not 100%, there exists some residual tensile strain in the cap layer. However, as used herein, the term "tensile strained" is not intended to encompass such small residual strain, but rather is intended to denote larger-magnitude tensile strain such as the strain of a silicon layer grown on the $Si_{0.8}Ge_{0.2}$ uniform cap having relaxation relative to the silicon substrate of greater than 98%.

The RITD structures were grown on p-type $Si_{0.8}Ge_{0.2}$ virtual substrates with a molecular beam epitaxy (MBE) growth system using elemental Si and Ge in electron-beam sources. The doping levels for both $n^+$ and $p^+$ layers were $5 \times 10^{19}$ $cm^{-3}$ while both the boron (B) and phosphorous (P) δ-doping sheet carrier concentrations were maintained at $1 \times 10^{14}$ $cm^{-2}$. Prior to device fabrication, portions of the grown wafers were annealed using a forming gas ambient ($N_2/H_2$) in a Modular Process Technology Corporation RTP-600S furnace at various temperatures for 1 minute. Ti/Au dots with various diameters were patterned on the surface of the wafers via standard contact lithography. A buffered oxide etch was used prior to metallization. Using the metal dots as a self-aligned mask, $HF/HNO_3$ wet etching was performed to isolate the diodes into mesas. Finally, a Ti/Au backside contact was evaporated on all of the samples.

With reference to FIG. 1, to study the effect of tensile strained Si layers, two epi-layer structures were designed. FIG. 1A shows the control structure (Structure A), which is similar to RITDs optimized on Si substrates for large PVCR reported in N. Jin et al., "Diffusion Barrier Cladding in Si/SiGe Resonant Interband Tunneling Diodes And Their Patterned Growth on PMOS Source/Drain Regions," *Special Issue on "Nanoelectronics" in IEEE Trans. Elect. Dev.*, vol. 50, pp. 1876-84 (2003), which is incorporated herein by reference in its entirety. Structure A of FIG. 1A includes: a $Si_{0.8}Ge_{0.2}$ substrate 10; a 260 nm p+ $Si_{0.8}Ge_{0.2}$ epitaxial layer 12; a 1 nm p+ $Si_{0.4}Ge_{0.6}$ epitaxial layer 14; a boron (B) δ-doping layer 16; a 4 nm intrinsic (i) $Si_{0.4}Ge_{0.6}$ spacer epitaxial layer 18; a 2 nm intrinsic (i) $Si_{0.8}Ge_{0.2}$ spacer epitaxial layer 20; a phosphorous (P) δ-doping layer 22; and a 100 nm n+ $Si_{0.8}Ge_{0.2}$ epitaxial layer 24. Structure A of FIG. 1A differs from those devices in that the Ge concentration of each layer 12, 14, 18, 20, 24 was raised by 20% to match the elevated Ge content in the virtual $Si_{0.8}Ge_{0.2}$ substrate 10. A larger Ge content in the spacer 18, 20 should reduce the tunneling barrier height and should also result in a higher PVCR, which is one of the predicted advantages for using the $Si_{0.8}Ge_{0.2}$ substrate 10.

Structure B of FIG. 1B includes: the $Si_{0.8}Ge_{0.2}$ substrate 10; the 260 nm p+ $Si_{0.8}Ge_{0.2}$ epitaxial layer 12; the 1 nm p+ $Si_{0.4}Ge_{0.6}$ epitaxial layer 14; the boron (B) δ-doping layer 16; the 4 nm intrinsic (i) $Si_{0.4}Ge_{0.6}$ spacer epitaxial layer 18; a 2 nm intrinsic (i) Si spacer epitaxial layer 30; the phosphorous (P) δ-doping layer 22; another 2 nm intrinsic (i) Si spacer epitaxial layer 32; and the 100 nm n+ $Si_{0.8}Ge_{0.2}$ epitaxial layer 24. In Structure B of FIG. 1B the tensile strained Si layers 30, 32 clad the phosphorous (P) δ-doping layer which deepens the conduction band quantum well by creating band offsets in the conduction band. FIG. 1B shows the designed structure with the phosphorous (P) δ-plane 22 clad by two 2-nm Si layers 30, 32.

Figure 2B:
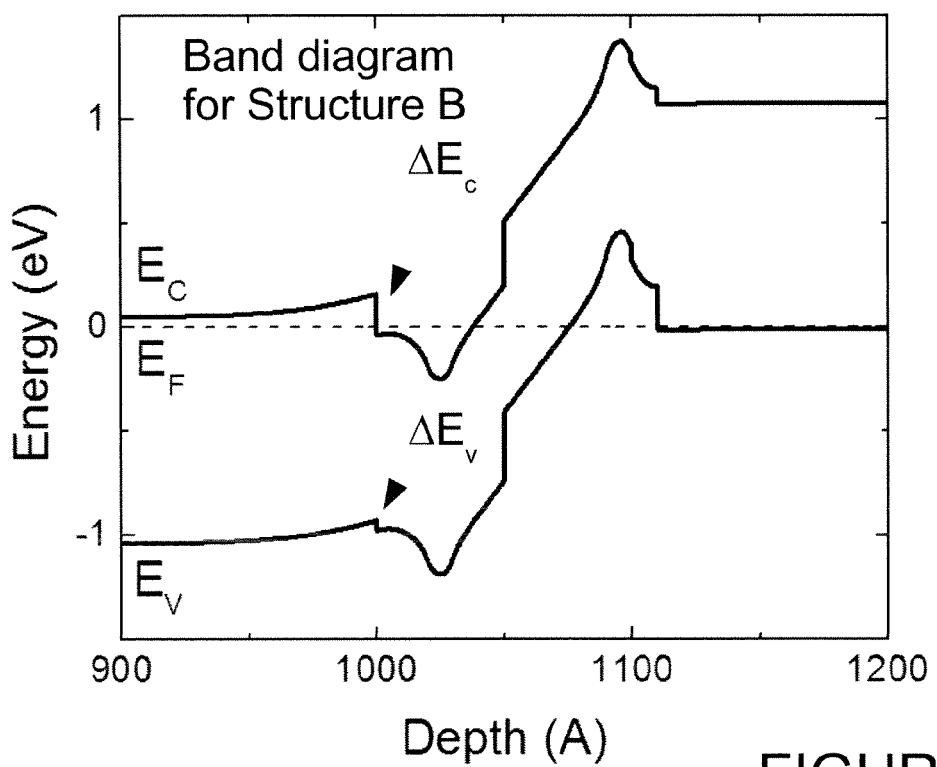

With reference to FIG. 2, the resulting band diagrams are shown for both structures (FIG. 2A corresponds to Structure A of FIG. 1A while FIG. 2B corresponds to Structure B of FIG. 1B) calculated using a one-dimensional Poisson and Schrödinger solver which obtains one-dimensional solution to the Poisson and Schrödinger equations self-consistently using a finite-difference method with a non-uniform mesh size. Compared to the control sample, there exists a conduction band offset ($\Delta E_c$) of 0.2 eV and a valence band offset ($\Delta E_v$) of 0.05 eV in Structure B induced by the tensile strain in the Si layer.

Figure 3:
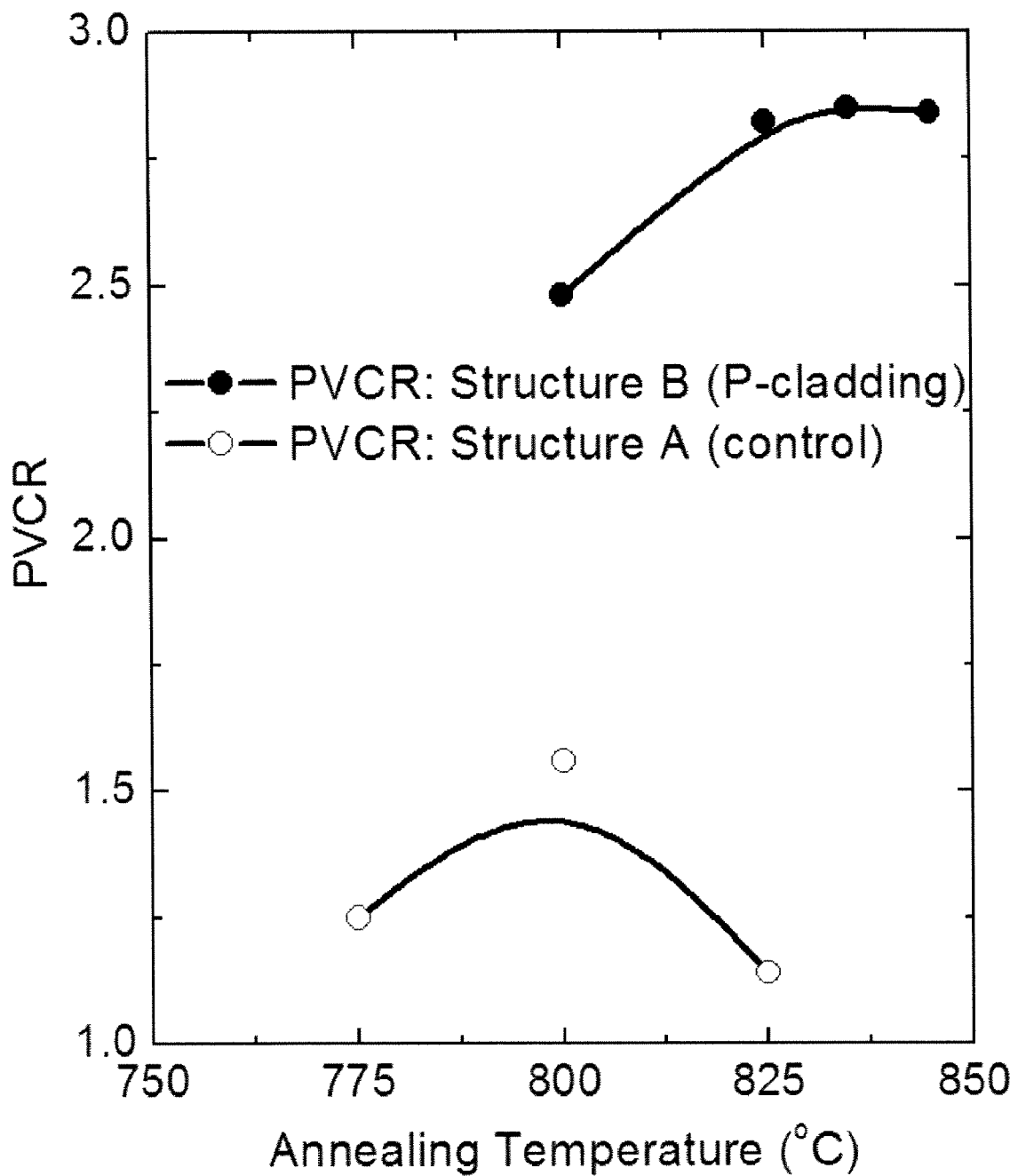
FIG. 3 plots peak-to-valley current ratio (PVCR) versus annealing temperature for interband tunneling diodes having Structure A and Structure B of FIGS. 1A and 1B, respectively.

With reference to FIG. 3, the peak-to-valley current ratio (PVCR) of each structure annealed at various temperatures for 1 minute is shown. The highest PVCR obtained from the control RITD on $Si_{0.8}Ge_{0.2}$ is 1.6, which is similar to the PVCR (1.36) of the interband tunneling diode (ITD) reported by Stoffel et al. grown on virtual $Si_{0.7}Ge_{0.3}$ substrate with a constant Ge composition throughout the epi-layers. It is believed that the PVCR obtained from the ITD grown on the virtual $Si_{0.7}Ge_{0.3}$ substrate is lower than the ITD grown directly on a Si substrate due to the surface roughness of virtual $Si_{0.7}Ge_{0.3}$ substrate. The insertion of Si cladding layers in Structure B substantially improves the highest PVCR to 2.8, which is a 1.8× increase.

Another significant performance difference between the two structures is the shift in the optimal annealing temperature. The higher optimal annealing temperature of the RITD with strained Si cladding the P layer suggests that this structure is more immune to dopant diffusion at high annealing temperatures. It is believed that the P diffusivity in compressively strained $Si_{1-x}Ge_x$ only slightly increases with x, because of an offsetting chemical and strain effect. Therefore, only a slight reduction in the P diffusivity is expected in the tensile strained Si layer of Structure B because of the offsetting chemical and strain effects. The observed significant performance difference between the two structures tested is thus not likely to be attributable to the slightly retarded P diffusion alone. A more likely explanation for the improved PVCR is that the strain induced band offset deepens the quantum well of the P δ-plane 22, as shown in FIG. 2B. The optimal annealing temperature is also increased, because the quantum well depth is not only dependent on the doping profile, but also on the strain-induced band offset. Therefore, the RITD can be annealed at a higher temperature, which is more effective to reduce point defects such as vacancies, without a concurrent reduction in quantum confinement compared to the control sample.

Figure 4:
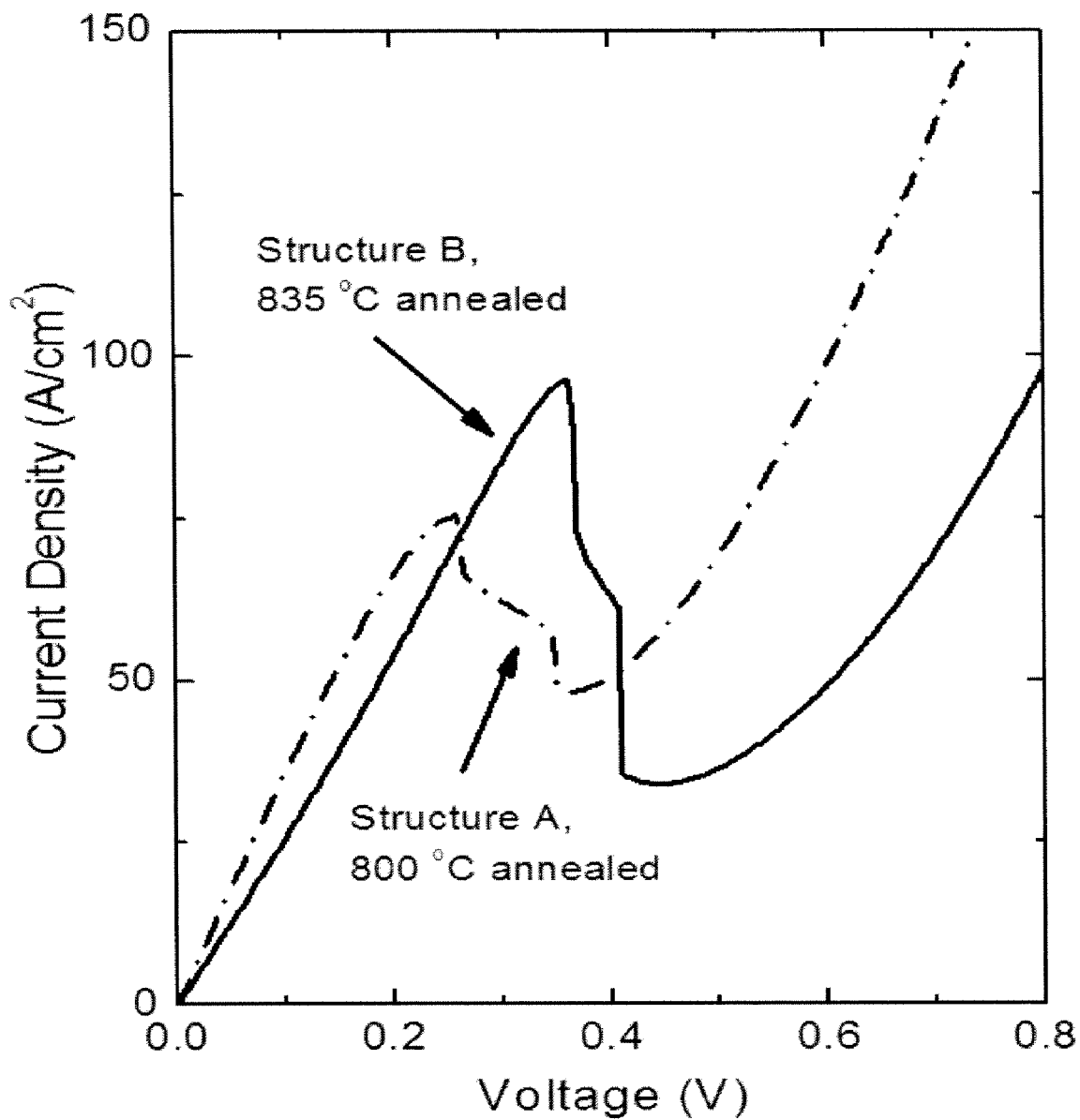
FIG. 4 plots current-voltage (I-V) characteristics of a device having Structure A depicted in FIG. 1A and a device having Structure B depicted in FIG. 1B, respectively, both annealed at their respective optimal anneal temperatures.

With reference to FIG. 4, current-voltage (I-V) characteristics of the two structures annealed by their optimal temperatures are shown. The comparison shows a higher peak current density and lower valley current density, hence a higher PVCR, of Structure B annealed at a higher temperature.

By using the virtual $Si_{0.8}Ge_{0.2}$ substrate, the Ge content in the spacer can be increased without exceeding the critical thickness. Additionally, the devices illustrated herein include a tensile strained Si layer (namely Si layers 30, 32 of Structure B shown in FIG. 2B), which provides enhanced flexibility in engineering the band structure of the RITD. By growing the tensile strained Si 30, 32 cladding the P δ-plane 22, the quantum well of P δ-plane 22 is deepened, as a result, an increase in the optimal annealing temperature and improved PVCR were observed.

By cladding the n-type δ-doping 22 with tensile strained silicon 30, 32, as is done in Structure B of FIG. 1B, it is believed that diffusion of the n-type dopant is suppressed. This has previously been found to be difficult to accomplish using compressively strained SiGe layers, and addition of cladding SiGe near the n-type δ-doping is generally not advantageous. Without being limited to any particular theory of operation, it is believed that the phosphorous dopant used herein diffuses predominantly by a vacancy-mediated diffusion process. SiGe is effective to reduce interstitial-mediated diffusion such as is believed to dominate for typical p-type dopants such as the boron dopant used in the present devices, since the larger germanium atoms and the compressive strain tends to reduce interstitial gaps. However, SiGe is less effective in suppressing vacancy-mediated diffusion, and indeed the increased alloy disorder may actually enhance vacancy concentrations. However, tensile strained silicon is believed to be effective at suppressing vacancy-mediated diffusion.

Although phosphorous is used as the n-type dopant in the samples fabricated herein, in other embodiments the n-type dopant may be arsenic, antimony, or so forth. Most n-type dopants including phosphorous, arsenic, and antimony are believed to diffuse predominantly through vacancy-mediated processes, and should therefore be contained effectively by one or more tensile silicon layers. Additionally, other tensile strained layers such as silicon germanium layers containing less germanium than the virtual substrate (i.e., $x_{Ge}$<0.2 for a $Si_{0.8}G_{0.2}$ virtual substrate) are expected to be effective at suppressing vacancy-mediated diffusion and at suppressing n-type dopant diffusion. Still further, while Structure B of FIG. 1B includes tensile strained silicon layers 30, 32 on both sides of the n-type δ-doping 22 (or, equivalently, the n-type δ-doping 22 is contained in a tensile strained silicon layer 30, 32), benefit is expected for a structure in which the tensile layer 32 is disposed only on the backside of the n-type δ-doping 22 (so as to suppress diffusion of the n-type dopant away from the p/n junction) and for a structure in which the tensile layer 30 is disposed only on between the n-type δ-doping 22 and the p/n junction (so as to suppress diffusion of the n-type dopant toward the p/n junction).

The devices of FIGS. 1A and 1B are of the p-on-n orientation. However, it is also contemplated to form n-on-p oriented devices. In some n-on-p oriented devices, it is contemplated to grow the device at a higher temperature to promote surface segregation of the n-type dopant, which is expected to provide a better profile of the n-type dopant in the bulk of the device.

Interband tunneling diodes comprising a plurality of substantially coherently strained layers including layers selected from a group consisting of silicon, germanium, and alloys of silicon and germanium are disclosed herein. The term "plurality of substantially coherently strained layers" is to be understood as encompassing a plurality of layers in which some layers are coherently strained and others are lattice matched to the substrate (or to the virtual substrate). Thus, for example, the device structures of FIGS. 1A and 1B are each considered to include a plurality of substantially coherently strained layers 12, 14, 18, 20, 24, 30, 32 (the latter two layers being included only in Structure B) that are coherently strained respective to the $Si_{0.8}Ge_{0.2}$ virtual substrate 10, and the plurality of substantially coherently strained layers include the $Si_{0.8}Ge_{0.2}$ layers 12, 20, 24 that are lattice matched to the $Si_{0.8}Ge_{0.2}$ virtual substrate 10.

Structure A of FIG. 1A includes no tensile-strained layers as that term is used herein, although it is understood that due to the virtual $Si_{0.8}Ge_{0.2}$ substrate 10 being about 98% relaxed there may be some slight residual tensile strain in the $Si_{0.8}Ge_{0.2}$ virtual substrate 10 and $Si_{0.8}Ge_{0.2}$ layers 12, 20, 24. Structure B of FIG. 1B includes tensile-strained Si layers 30, 32 cladding or containing the n-type (P) delta doping 22. Both structures A and B include compressively strained $Si_{0.4}Ge_{0.6}$ layers 14, 18.

In III-V double quantum well RITDs, outside barriers have been used to block the non-resonant tunneling current component and hence improve the PVCR. See J. M. Xu et al., "Study of peak and valley currents in double quantum-well RITDs". *Semiconductor Science and Technology*, vol. 7, pp. 1097-1102 (1992). As disclosed herein, the use of the illustrated $Si_{0.8}Ge_{0.2}$ substrate 10 enables the introduction of outside barriers in Si-based devices by employing strain induced band offsets.

With reference to FIGS. 5A and 5B, two more epi-layer structures were designed to study the effect of outside barriers. The control structure (Structure C) is shown in FIG. 5A, which is similar to Structure B with Si layers 30', 32 cladding the P δ-doping layer 22, except for a small modification to the overall tunnel spacer thickness (6 nm to 5 nm corresponding to a 1 nm reduction in thickness of Si layer 30 to produce modified Si layer 30') and the Ge percentage (60% to 50%, that is, $Si_{0.4}Ge_{0.6}$ layers 14, 18 are reduced in Ge content by 10% to produce modified $Si_{0.5}Ge_{0.5}$ layers 14', 18'). Thus, Structure C of FIG. 5A includes: the $Si_{0.8}Ge_{0.2}$ substrate 10; the 260 nm p+ $Si_{0.8}Ge_{0.2}$ epitaxial layer 12; the 1 nm p+ $Si_{0.5}Ge_{0.5}$ epitaxial layer 14'; the boron (B) δ-doping layer 16; the 4 nm intrinsic (i) $Si_{0.5}Ge_{0.5}$ spacer epitaxial layer 18'; the 1 nm intrinsic (i) Si spacer epitaxial layer 30'; the phosphorous (P) δ-doping layer 22; the 2 nm intrinsic (i) Si spacer epitaxial layer 32; and the 100 nm n+ $Si_{0.8}Ge_{0.2}$ epitaxial layer 24.

Structure D shown in FIG. 5B is similar to Structure C of FIG. 5A, but further includes outside barriers formed by a 2 nm tensile strained Si layer 40 on the p-side and a 2 nm compressively strained $Si_{0.5}Ge_{0.5}$ layer 42 on the n-side. Thus, Structure D of FIG. 5B includes: the $Si_{0.8}Ge_{0.2}$ substrate 10; the 260 nm p+ $Si_{0.8}Ge_{0.2}$ epitaxial layer 12; the 2 nm p+ silicon layer 40; the 1 nm p+ $Si_{0.5}Ge_{0.5}$ epitaxial layer 14'; the boron (B) δ-doping layer 16; the 4 nm intrinsic (i) $Si_{0.5}Ge_{0.5}$ spacer epitaxial layer 18'; the 1 nm intrinsic (i) Si spacer epitaxial layer 30'; the phosphorous (P) δ-doping layer 22; the 2 nm intrinsic (i) Si spacer epitaxial layer 32; the 2 nm n+ $Si_{0.5}Ge_{0.5}$ layer 42; and the 100 nm n+ $Si_{0.8}Ge_{0.2}$ epitaxial layer 24.

Figure 6:
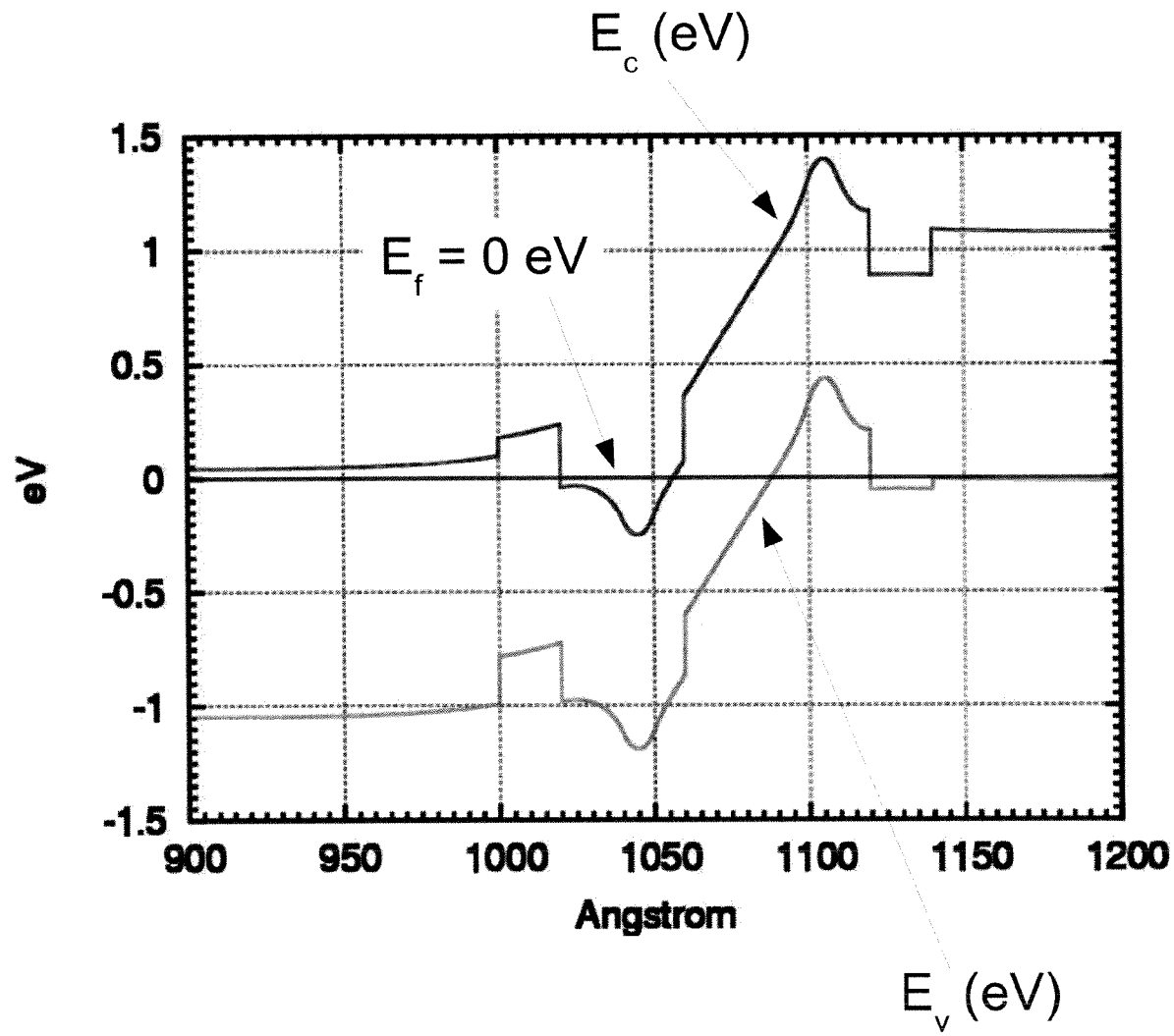
FIG. 6 diagrammatically illustrates a band diagram for Structure D of FIG. 5B.

As plotted in FIG. 6, which shows a calculated band diagram for structure D of FIG. 5B, a 0.2 eV valence band quantum well with a 0.05 eV outside barrier and a 0.2 eV conduction band quantum well with a 0.1 eV outside barrier is formed. It is believed that the outside barriers 40, 42 effectively block the non-resonant tunneling current component by increasing its effective tunneling barrier width. Furthermore, the outside barriers 40, 42 can also deepen the quantum well, so that a better quantum state confinement can be achieved. Note, that the Ge content is reduced in Structures C and D compared to Structures A and B, in order to safely increase the thicker aggregate germanium content layer thickness from 5 nm to 7 nm without inducing misfit dislocations.

Figures 7A, 7B:
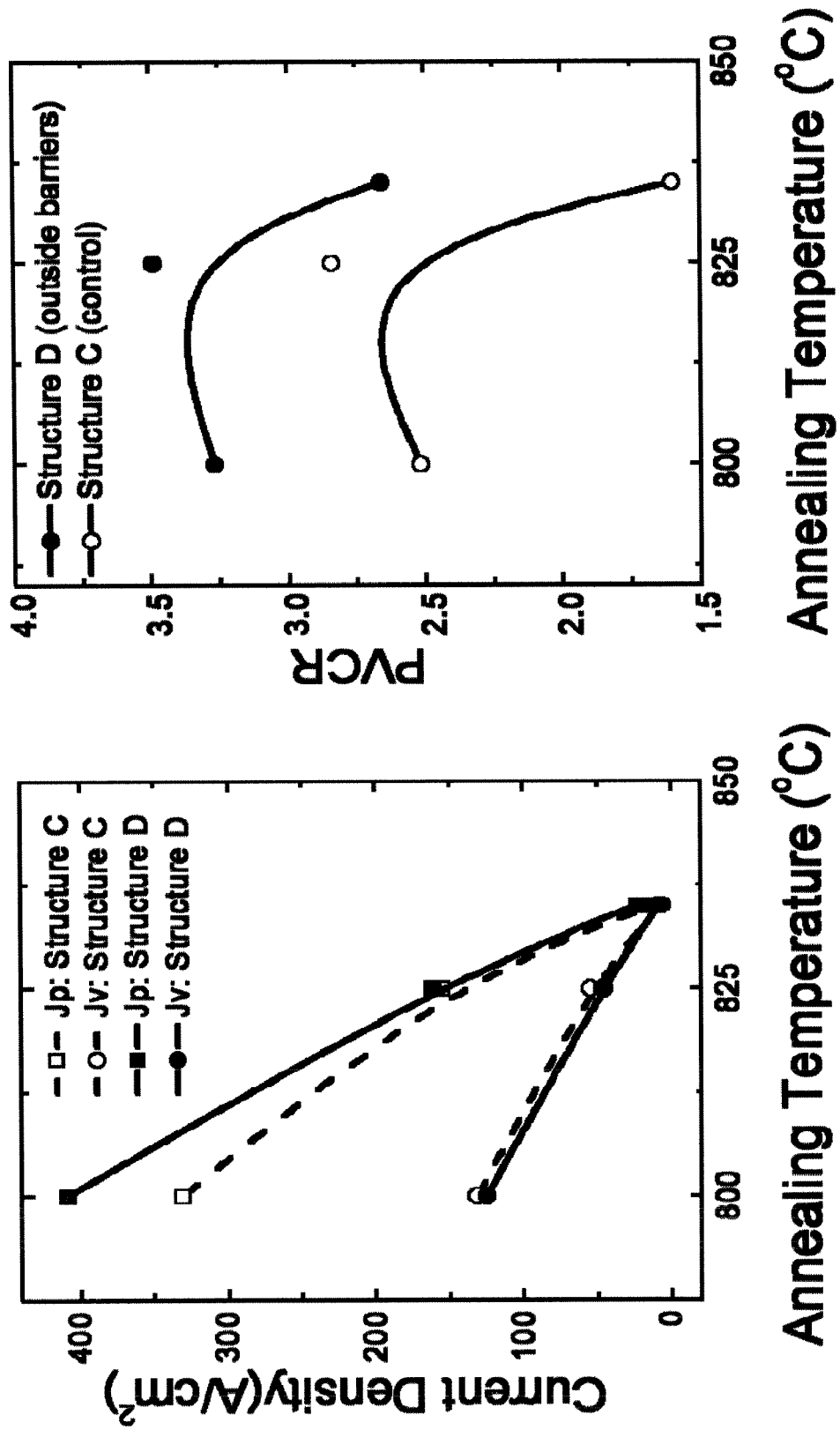
FIGS. 7A and 7B plot current density in $A/cm^2$ and peak-to-valley current ratio (PVCR), respectively, versus annealing temperature for interband tunneling diodes having Structure C and Structure D of FIGS. 5A and 5B, respectively.

With reference to FIGS. 7A and 7B, the current density and PVCR performance is compared for RITD devices with and without outside barriers (that is, Structure D versus Structure C). The peak current densities of RITDs with outside barriers (structure D) annealed at various temperatures are higher than the control sample (structure C), while the valley current densities of RITDs with outside barriers are lower than the control RITDs. The increased peak current density and decreased valley current density suggest the outside barriers 40, 42 both deepen the quantum well and block the non-resonant tunneling current. As a result, the PVCR of RITDs with outside barriers 40, 42 (that is, Structure D of FIG. 5B) are significantly higher than for the control RITDs (1.2× compared to Structure C and 2.2× compared to Structure A). The highest PVCR of 3.5 is obtained with the modified RITD of Structure D using an 825° C. anneal for 1 minute.

Structures B and D (FIGS. 1B and 5B) show improvement over their control samples by utilizing the strain-induced band offset. The highest overall PVCR achieved on the illustrated $Si_{0.8}Ge_{0.2}$ substrate 10 is 3.5, which is significantly higher than has been obtained previously on strain-relaxed SiGe virtual substrates, but is slightly lower than 3.8, the highest PVCR value obtained using a standard Si substrate fabricated with the same wet etching process. See, Niu Jin et al., "Diffusion Barrier Cladding in Si/SiGe Resonant Interband Tunneling Diodes And Their Patterned Growth on PMOS Source/Drain Regions," *Special Issue on "Nanoelectronics" in IEEE Transactions on Electron Devices*, vol. 50, pp. 1876-84 (2003) which is incorporated herein by reference in its entirety; and Niu Jin et al., "The Effect of Spacer Thickness on Si-based Resonant Interband Tunneling Diode Performance and their Application to Low-Power Tunneling Diode SRAM Circuits," *IEEE Transactions on Electron Devices*, vol. 53, pp. 2243-49 (2006), which is incorporated herein by reference in its entirety. The suppressed overall performance of all the RITDs on $Si_{0.8}Ge_{0.2}$ virtual substrates is believed to be due to the higher dislocation densities, higher surface roughness, or other quality issues with the strain-relaxed substrates. The $Si_{0.8}Ge_{0.2}$ substrates used for these studies exhibit a cross-hatching pattern on the wafer surface even after epitaxial grown of the RITD structure, which is indicative of a substantial surface roughness.

Figure 8A:
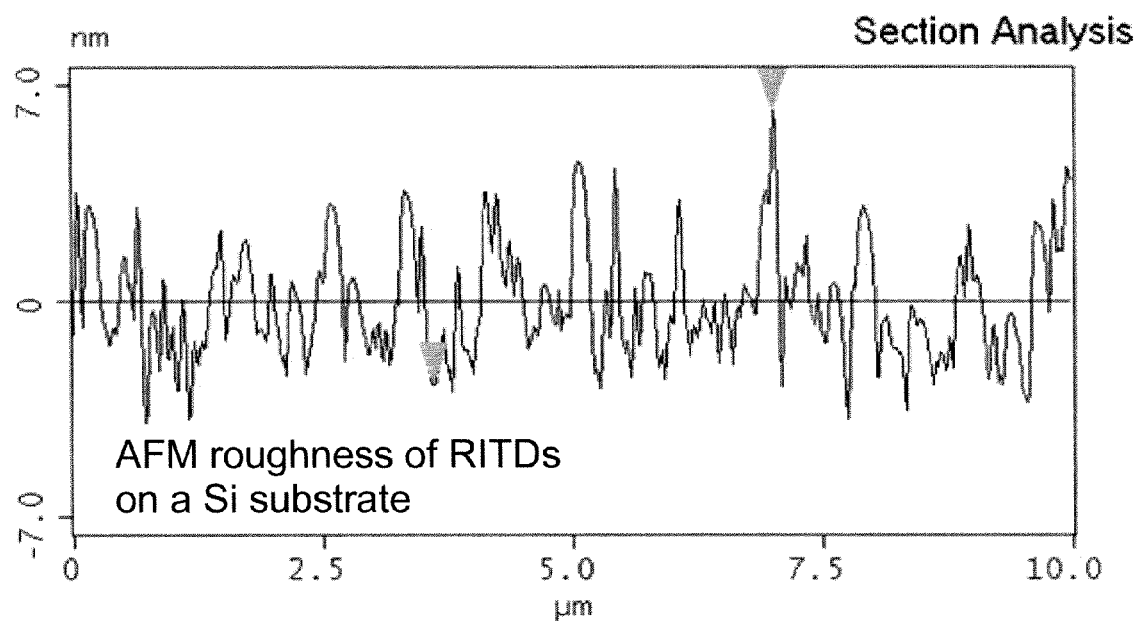
FIGS. 8A and 8B plot root mean square (RMS) surface roughness as measured by atomic force microscopy (AFM)
Figure 8B:
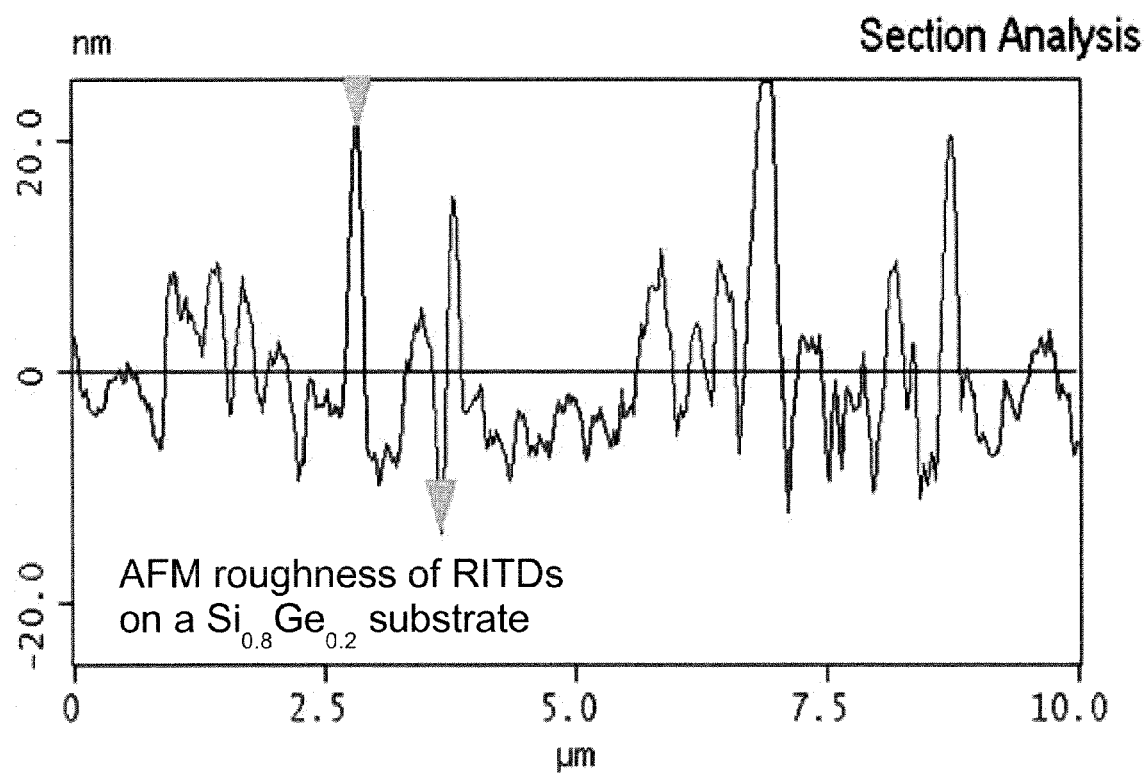

With reference to FIGS. 8A and 8B, atomic force microscopy (AFM) was used to characterize the surface roughness before and after the molecular beam epitaxy (MBE) growth. Over a range of 10 μm region, the $R_{max}$ and root mean square (RMS) surface roughness of RITDs on a Si substrate are about 8.5 nm and 1.9 nm, respectively, while the values increase to 35.1 nm, 7.2 nm for RITDs on $Si_{0.8}Ge_{0.2}$ substrate. Note, the total thickness of the active RITD layers is only 6-10 nm, which is a much smaller value compared to the surface roughness of the RITD on $Si_{0.8}Ge_{0.2}$ substrate. It is then not surprising that the overall device performance could be significantly degraded by the large surface roughness versus conventional Si (100) substrates. Substantially higher PVCR values are expected for RITDs grown on a higher quality SiGe substrates with reduced surface roughness. Such higher quality substrates can be generated by bulk crystal growth, or by post-growth processing of virtual substrates on silicon wafers such as chemo-mechanical polishing, or by improved epitaxial growth of the virtual substrate on a silicon wafer such as by using a thicker buffer, optimized growth temperatures, or so forth.

Although interband tunneling diodes comprising a plurality of substantially coherently strained layers including layers selected from a group consisting of silicon, germanium, and alloys of silicon and germanium are disclosed herein as illustrative examples, it is also contemplated to form such devices in other material systems. For example, it is contemplated to use an InGaAs virtual substrate formed on GaAs, where the InGaAs has a larger lattice constant than GaAs and the InGaAs virtual substrate is formed by using a compositionally graded buffer that is graded from GaAs to InGaAs of the desired In composition. In such a device, the coherently strained layers can include binary, ternary, or quaternary alloys of GaAs, AlAs, and InAs, for example, with tensile or compressive strain of an individual layer being determined principally by the indium/(aluminum plus gallium) content of the layer (with much lower effect due to the aluminum/gallium content ratio). Fabricating the disclosed interband tunneling diodes of layers comprising other III-V alloys is also contemplated.

Respecting the tunnel barriers 40, 42 of Structure D depicted in FIG. 5B, it should be noted that although the tested structure includes both tunnel barriers (the tensile strained 2 nm p+ Si layer 40 and the compressively strained 2 nm n+ $Si_{0.5}Ge_{0.5}$ 42), it is contemplated to employ either one tunnel barrier by itself. Either barrier by itself, or both barriers 40, 42 as in the structure of FIG. 5B, effectively deepen the QW and block the non-resonant tunneling current, hence increase the peak current density and suppress the valley current density simultaneously, thus improving the PVCR.

The preferred embodiments have been described. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A device comprising:
   a plurality of substantially coherently strained layers defining an interband tunneling junction;
   wherein at least one of said substantially coherently strained layers is tensile strained.

2. The device as set forth in claim 1, wherein the plurality of substantially coherently strained layers comprise:
   layers selected from a group consisting of Si, Ge, C, Sn, $Si_{1-x}Ge_x$, $Si_{1-x}C_x$, $Si_{1-x}Sn_x$, $Si_{1-x-y}Ge_xC_y$, $Si_{1-x-y-z}Ge_xC_ySn_z$, $Si_{1-x}O_x$, $Si_{1-x}N_x$, $Al_{1-x}O_x$, or combinations thereof;
   wherein at least one of said substantially coherently strained layers selected from the group consisting of Si, Ge, C, Sn, $Si_{1-x}Ge_x$, $Si_{1-x}C_x$, $Si_{1-x}Sn_x$, $Si_{1-x-y}Ge_xC_y$, $Si_{1-x-y-z}Ge_xC_ySn_z$, $Si_{1-x}O_x$, $Si_{1-x}N_x$, $Al_{1-x}O_x$, or combinations thereof is tensile strained.

3. The device as set forth in claim 1, wherein the plurality of substantially coherently strained layers comprise:
   layers selected from a group consisting of Si, Ge, C, Sn, $Si_{1-x}Ge_x$, $Si_{1-x}C_x$, $Si_{1-x}Sn_x$, $Si_{1-x-y}Ge_xC_y$, $Si_{1-x-y-z}Ge_xC_ySn_z$, $Si_{1-x}O_x$, $Si_{1-x}N_x$, $Al_{1-x}O_x$, or combinations thereof;
   wherein at least one of said substantially coherently strained layers selected from the group consisting of Si, Ge, C, Sn, $Si_{1-x}Ge_x$, $Si_{1-x}C_x$, $Si_{1-x}Sn_x$, $Si_{1-x-y}Ge_xC_y$, $Si_{1-x-y-z}Ge_xC_ySn_z$, $Si_{1-x}O_x$, $Si_{1-x}N_x$, $Al_{1-x}O_x$, or combinations thereof is a tensile strained silicon layer.

4. The device as set forth in claim 1, wherein the plurality of substantially coherently strained layers comprise:
   layers selected from a group consisting of binary, ternary, or quaternary alloys of GaAs, AlAs, and InAs;
   wherein at least one of said substantially coherently strained layers selected from the group consisting of binary, ternary, or quaternary alloys of GaAs, AlAs, and InAs is tensile strained.

5. The device as set forth in claim 1, wherein the plurality of substantially coherently strained layers comprise:
   layers selected from a group consisting of III-V alloys;
   wherein at least one of said substantially coherently strained layers selected from the group consisting of III-V alloys is tensile strained.

6. The device as set forth in claim 1, wherein at least one of said substantially coherently strained layers is a tensile strained Si-compatible layer arranged to suppress diffusion of a dopant.

7. The device as set forth in claim 1, wherein at least one of said substantially coherently strained layers is a Si-compatible tensile strained layer arranged to enhance at least one of (i) a conduction band quantum well and (ii) a valence band quantum well.

8. The device as set forth in claim 1, wherein at least one of said substantially coherently strained layers is a Si-compatible tensile strained layer containing degenerate doping.

9. The device as set forth in claim 1, wherein the interband tunneling junction is a resonant interband tunneling junction, and at least one of said substantially coherently strained layers is a Si-compatible layer that suppresses a non-resonant tunnel current.

10. The device as set forth in claim 1, wherein the plurality of substantially coherently strained layers comprise layers selected from a group consisting of Si, Ge, C, Sn, $Si_{1-x}Ge_x$, $Si_{1-x}C_x$, $Si_{1-x}Sn_x$, $Si_{1-x-y}Ge_xC_y$, $Si_{1-x-y-z}Ge_xC_ySn_z$, $Si_{1-x}O_x$, $Si_{1-x}N_x$, $Al_{1-x}O_x$, or combinations thereof, and wherein at least one of said substantially coherently strained layers selected from the group consisting of Si, Ge, C, Sn, $Si_{1-x}Ge_x$, $Si_{1-x}C_x$, $Si_{1-x}Sn_x$, $Si_{1-x-y}Ge_xC_y$, $Si_{1-x-y-z}Ge_xC_ySn_z$, $Si_{1-x}O_x$, $Si_{1-x}N_x$, $Al_{1-x}O_x$, or combinations thereof is tensile strained, the device further comprising:
   a silicon substrate; and
   a substantially strain-relaxed layer of germanium or an alloy of silicon and germanium disposed on the silicon substrate; and
   a compositionally graded strain relaxation buffer disposed between the substantially strain-relaxed layer of germanium or an alloy of silicon and germanium and the silicon substrate;
   wherein the plurality of substantially coherently strained layers selected from the group consisting of silicon, germanium, and alloys of silicon and germanium is disposed on and coherently strained with the strain-relaxed layer of germanium or an alloy of silicon and germanium.

11. The device as set forth in claim 1, wherein the interband tunneling junction is a resonant interband tunneling junction and at least one of said substantially coherently strained layers is a tensile strained layer that suppresses a non-resonant tunnel current.

12. The device as set forth in claim 1, wherein at least one of said substantially coherently strained layers is tensile strained and is arranged to suppress vacancy-mediated diffusion of a selected dopant.

13. The device as set forth in claim 1, wherein at least one of said substantially coherently strained layers is tensile strained and is degenerately doped with a dopant that diffuses by a vacancy-mediated diffusion process.

14. A device comprising:
   a plurality of substantially coherently strained layers defining an interband tunneling junction,
   at least one of said substantially coherently strained layers defining a barrier to a non-resonant tunnel current.

15. The device as set forth in claim 14, wherein the plurality of substantially coherently strained layers comprise:
   layers selected from a group consisting of Si, Ge, C, Sn, $Si_{1-x}Ge_x$, $Si_{1-x}C_x$, $Si_{1-x}Sn_x$, $Si_{1-x-y}Ge_xC_y$, $Si_{1-x-y-z}Ge_xC_ySn_z$, $Si_{1-x}O_x$, $Si_{1-x}N_x$, $Al_{1-x}O_x$, or combinations thereof.

16. The device as set forth in claim 14, wherein the plurality of substantially coherently strained layers comprise:
   layers selected from a group consisting of III-V alloys.

17. The device as set forth in claim 14, wherein at least one of said substantially coherently strained layers is a tensile strained layer that defines a barrier to a non-resonant tunnel current component.

18. The device as set forth in claim 17, wherein at least one of said substantially coherently strained layers is a compressively strained layer that defines a barrier to a non-resonant tunnel current component.

19. The device as set forth in claim 14, wherein at least one of said substantially coherently strained layers is a compressively strained layer that defines a barrier to a non-resonant tunnel current component.

20. The device as set forth in claim 14, wherein none of the plurality of substantially coherently strained layers is tensile strained.

21. A method for fabricating an interband tunneling junction, the method comprising:
   forming a strain-relaxed layer of a second lattice constant on a substrate of a first lattice constant, the second lattice constant being larger than the first lattice constant; and
   forming the plurality of substantially coherently strained layers on the strain-relaxed layer such that the plurality of substantially coherently strained layers are substantially coherently strained respective to the second lattice constant.

22. The method as set forth in claim 21, wherein the forming of the strain-relaxed layer comprises:
   forming a compositionally graded buffer starting lattice-matched to the first lattice constant and finishing closer to being lattice-matched to the second lattice constant than to the first lattice constant.

23. The method as set forth in claim 21, wherein the substrate of a first lattice constant is silicon, the strain-relaxed layer of a second lattice constant is an alloy of silicon and germanium, the plurality of substantially coherently strained layers are selected from a group consisting of silicon, germanium, and alloys of silicon and germanium, and the method further comprises:

after the forming the plurality of substantially coherently strained layers on the strain-relaxed layer, annealing the plurality of substantially coherently strained layers on the strain-relaxed layer at an annealing temperature effective for enhancing a peak-to-valley current ratio (PVCR).

24. The method as set forth in claim 23, wherein the forming of the plurality of substantially coherently strained layers comprises:

forming a tensile layer of silicon or of an alloy of silicon and germanium having a lower concentration of germanium than the strain-relaxed layer whereby the tensile layer is tensile strained respective to the second lattice constant.

25. The method as set forth in claim 21, wherein the forming of the plurality of substantially coherently strained layers comprises:

epitaxially depositing said plurality of substantially coherently strained layers using molecular beam epitaxy.

\* \* \* \* \*